United States Patent
Chung et al.

(10) Patent No.: US 7,894,013 B2
(45) Date of Patent: Feb. 22, 2011

(54) LIQUID CRYSTAL DISPLAY AND MANUFACTURING METHOD THEREOF

(75) Inventors: Jaemo Chung, Yongin-si (KR); Byungjun Lee, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 253 days.

(21) Appl. No.: 12/165,265

(22) Filed: Jun. 30, 2008

(65) Prior Publication Data

US 2009/0009682 A1      Jan. 8, 2009

(51) Int. Cl.
*G02F 1/1333*      (2006.01)

(52) U.S. Cl. .................. 349/58; 349/149; 362/613; 362/633

(58) Field of Classification Search ............ None
See application file for complete search history.

(56) References Cited

U.S. PATENT DOCUMENTS

| | | | | |
|---|---|---|---|---|
| 7,445,369 | B2* | 11/2008 | Yu et al. | ............. 362/612 |
| 2002/0051349 | A1 | 5/2002 | Serizawa et al. | |
| 2005/0259387 | A1 | 11/2005 | Sung et al. | |
| 2005/0286008 | A1* | 12/2005 | Miyagawa et al. | ......... 349/158 |
| 2006/0006777 | A1 | 1/2006 | Lo et al. | |
| 2006/0114694 | A1 | 6/2006 | Cho et al. | |
| 2006/0146263 | A1 | 7/2006 | Park et al. | |
| 2006/0232999 | A1* | 10/2006 | Chang et al. | ............. 362/633 |

FOREIGN PATENT DOCUMENTS

| | | |
|---|---|---|
| KR | 1020060128249 | 12/2006 |
| KR | 1020070011751 | 1/2007 |
| KR | 10-2007-0054353 | 5/2007 |
| KR | 1020080073128 | 8/2008 |

OTHER PUBLICATIONS

Korean Patent Abstracts, Publication No. 1020070054353 A, Published on May 29, 2007, in the name of Jang.
European Search Report dated Sep. 30, 2008 for corresponding Korean Patent Application No. 10-2007-0066199, listing the cited U.S. patent documents in this IDS.

* cited by examiner

*Primary Examiner*—Hemang Sanghavi
(74) *Attorney, Agent, or Firm*—Christie, Parker & Hale, LLP

(57) ABSTRACT

A liquid crystal display includes a frame having a coupling groove, an optical sheet adjacent the frame, and a flexible printed circuit on a side of the optical sheet, wherein the flexible printed circuit is coupled to the frame at the coupling groove. A manufacturing method for a liquid crystal display includes providing a frame having a coupling groove, providing an optical sheet adjacent the frame, and providing a flexible printed circuit on a side of the optical sheet and coupling the flexible printed circuit to the frame at the coupling groove.

20 Claims, 4 Drawing Sheets

LIQUID CRYSTAL DISPLAY AND MANUFACTURING METHOD THEREOF

CROSS-REFERENCE TO RELATED APPLICATION

This application claims priority to and the benefit of Korean Patent Application No. 10-2007-0066199, filed on Jul. 2, 2007, the entire content of which is incorporated herein by reference.

BACKGROUND OF THE INVENTION

1. Field of the Invention

The present invention relates to a liquid crystal display and a manufacturing method thereof, and more specifically to a frame for liquid crystal display and a manufacturing method thereof.

2. Description of the Related Art

When assembling a backlight unit, a liquid crystal display panel, and a flexible printed circuit of a liquid crystal display, double-sided tape is typically used for attaching certain components. Conventional liquid crystal displays often include a frame, a flexible printed circuit, and a liquid crystal panel.

In the case of a flexible printed circuit, there are many structures that extend from a front to a rear of a frame. However, sometimes the flexible printed circuit is loosened due to the resilience of the bent flexible printed circuit. The loosened flexible printed circuit and accompanying loosened liquid crystal display panel formed on a upper surface may undermine reliability of the liquid crystal display.

SUMMARY OF THE INVENTION

According to aspects of the present invention, a liquid crystal display and a manufacturing method thereof are provided, the liquid crystal display forming a structure adapted to mount a flexible printed circuit by having a groove on a frame of a backlight unit BLU, making it possible to prevent the loosening of the flexible printed circuit due to its resilience. It is another aspect of the present invention to allow the flexible printed circuit to be easily coupled to the coupling groove by including a curved surface on an upper surface of a coupling groove.

In one embodiment, a liquid crystal display is provided including a frame having a coupling groove, an optical sheet adjacent the frame, and a flexible printed circuit on a side of the optical sheet, wherein the flexible printed circuit is coupled to the frame at the coupling groove.

In one embodiment, the frame sidewalls for supporting a window, wherein the coupling groove is defined by a surface of the sidewalls, and a base having a portion absent the sidewalls. The coupling groove may be located at an intersection of the sidewalls and the base and may have a hexahedral shape. The coupling groove may be defined by an inner surface of the sidewalls and the sidewalls may extend above the coupling groove for preventing resilience of the flexible printed circuit coupled to the coupling groove. In one embodiment, the sidewalls include a curved surface on an upper surface of the coupling groove adapted to contact the flexible printed circuit when the flexible printed circuit is coupled to the coupling groove. A cross-section of the coupling groove may be a quadrantal shape.

In one embodiment, the flexible printed circuit includes a planar portion, an edge extending along the planar portion, wherein the edge is coupled to the coupling groove, and a bending portion connected to the planar portion, the bending portion being folded when the flexible printed circuit is coupled to the frame. Further, a thickness of the edge may be less than a thickness of the coupling groove.

A manufacturing method for a liquid crystal display includes providing a frame having a coupling groove, providing an optical sheet adjacent the frame, and providing a flexible printed circuit on a side of the optical sheet and coupling the flexible printed circuit to the frame at the coupling groove.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
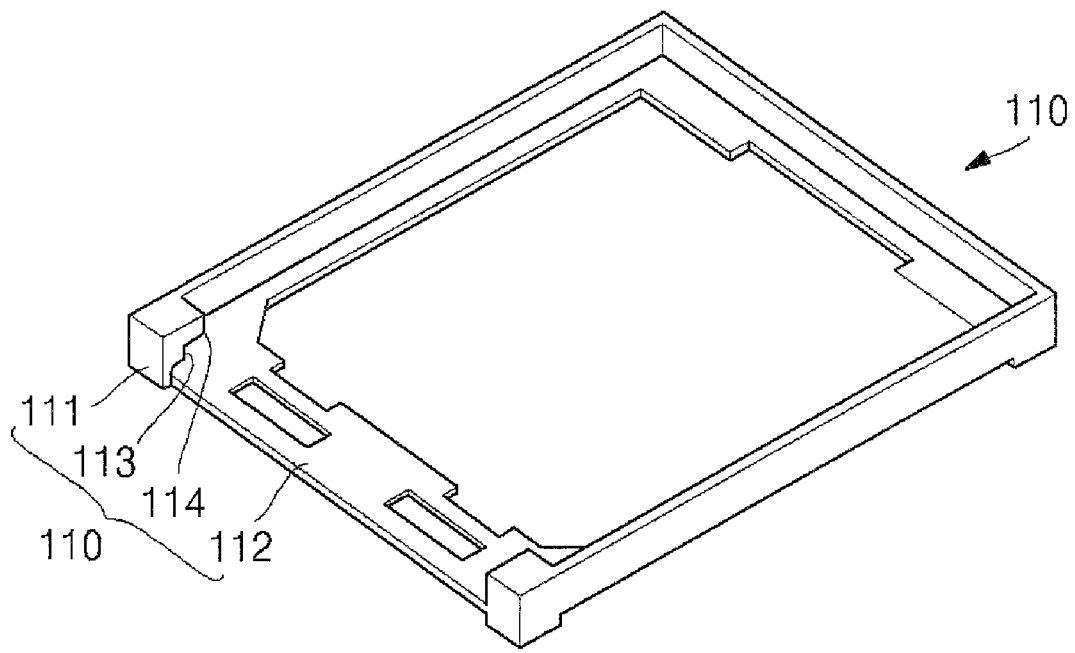
FIG. 1 is a perspective view of a frame of a liquid crystal display according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Hereinafter, a constitution of a frame 110 of a liquid crystal display 100 (FIG. 2) according to an embodiment of the present invention will be described. FIG. 1 is a perspective view showing a frame 110 of the liquid crystal display according to an embodiment of the present invention.

As shown in FIG. 1, the frame 110 is a basic frame for a liquid crystal display and includes sidewalls 111, a base 112 having a section absent the sidewalls 111, a coupling groove 113 formed on or defined by one surface of the sidewalls 111, and a curved surface 114 formed on a portion of the coupling groove 113. The sidewalls 111 have a substantially constant height along an edge of the frame 110 for supporting a window on the liquid crystal display panel.

The base 112 extends across a region of the frame 110 and has a portion absent sidewalls. The base 112 provides a path for connecting the flexible printed circuit to an external PCB as described in more detail below. The flexible printed circuit connects the external PCB, a backlight unit BLU, and a high-density integrated circuit to each other. Therefore, in order to connect the flexible printed circuit to the external PCB, a region absent the sidewalls of the frame 110 is defined by a portion of the base 112.

Referring to FIG. 1, the coupling groove 113 is formed on or defined by one surface of the sidewalls 111, and more specifically, may be on the inside of the sidewalls contacting to the base 112. Further, the coupling groove 113 may be engraved in the inside of the base in a hexahedral shape and the flexible printed circuit may be coupled thereto. As described above, various structures assembled by being extended to a rear of the frame 110 experience resilience of the flexible printed circuit actions thereon.

In the prior art, resilience may loosen the flexible printed circuit. However, in the liquid crystal display 100 according to the present invention, the coupling groove 113 fixes the flexible printed circuit to prevent or significantly reduce loosening. The base 112 contacts the coupling groove 113 to prevent the resilience of a flexible printed circuit, thereby preventing or significantly reducing loosening of the flexible printed circuit.

The curved surface 114 is formed on or is defined by the upper surface of the coupling groove 113 in the base and may have a generally quadrantal shape, the curved surface 114 making the flexible printed circuit easy to couple to the coupling groove 113 in a manufacturing process. In conventional frames, the base may interfere with the flexible printed circuit and therefore, the flexible printed circuit may not be adequately coupled to the coupling groove 113 in the manufacturing process. However, in the present embodiment, when the flexible printed circuit contacts the curved surface 114, the curved surface 114 is formed adjacent the base 112, allowing the flexible printed circuit to be connected to the coupling groove 113 by being folded along the curved surface 114.

As described above, the liquid crystal display 100 according to an embodiment of the present invention includes the frame 110 with the coupling groove 113. The flexible printed circuit is coupled to the coupling groove 113, making it possible to prevent loosening due to the resilience of the flexible printed circuit. Also, the curved surface 114 is formed on an upper portion of the coupling groove 113 so that the flexible printed circuit can be easily coupled to the coupling groove 113.

Hereinafter, the manufacturing order of the liquid crystal display 100 according to the present invention will be described.

Figure 2:
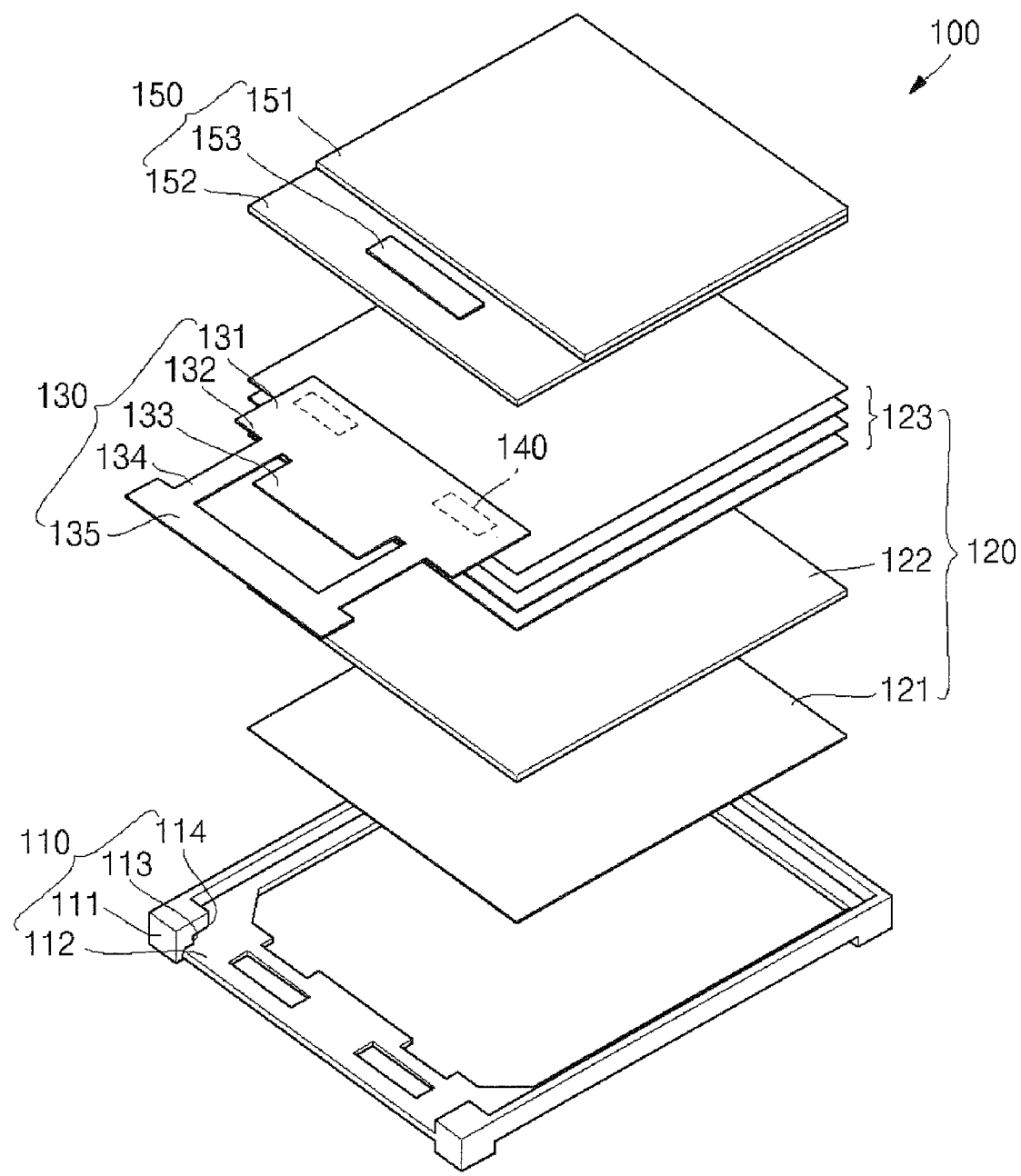
FIG. 2 is an exploded perspective view of a liquid crystal display according an embodiment of the present invention.

FIG. 2 is an exploded perspective view of the liquid crystal display 100 according to an embodiment of the present invention.

Referring to FIG. 2, the liquid crystal display 100 according to the present invention includes a frame 110, a panel lower layer 120 formed on the upper surface of the frame 110, a flexible printed circuit 130 formed on one side of the panel lower layer 120, a backlight unit 140 formed on a rear surface of the flexible printed circuit 130, and a liquid crystal display panel 150 formed on the upper surface of the panel lower layer 120.

The frame 110 includes sidewalls 111, a base 112, a coupling groove 113, and a curved surface 114. As described above, the flexible printed circuit 130 is coupled to the coupling groove 113 so that looseness of the flexible printed circuit 130 is prevented or significantly reduced and so that the flexible printed circuit 130 is easily coupled to the coupling groove 113 along the curved surface 114. The explanation of the frame 110 is the same as described above and thus, the explanation thereof will be omitted.

The panel lower layer 120 may include a reflection plate 121, a light guide plate 122 formed adjacent the reflection plate 121, and an optical sheet 123 formed adjacent of the light guide plate 122.

The reflection plate 121 is formed on the upper surface of the frame 110, and more specifically, may be on an upper surface of the base 112. The reflection plate 121 reflects light incident from the backlight unit 140 toward the liquid crystal display panel 150. The reflection plate 121 may be primarily a substrate of polyester polyethylene terephthalate (PET) material and has a light-reflecting function for reducing loss of light incident from the light guide plate 122.

The light guide plate 122 is formed adjacent the reflection plate 121. The light guide plate 122 may be primarily formed of acryl poly methyl methacrylate (PMMA) and the pattern of the light guide plate guides incident light uniformly from the light source. The light guide plate 122 may be manufactured by an injection molding method or by a casting method.

The optical sheet 123 is formed adjacent the light guide plate 122 and it may include two diffusion sheets and two prism sheets formed between the diffusion sheets. The diffusion sheet is primarily manufactured by using acrylic based resin on the substrate of polyester PET to uniformly distribute the light source emitted from the light guide plate 122 and at the same time, to condense light. The diffusion sheet primarily protects the prism sheet, and may also be referred to as a protective film.

The prism sheet primarily uses acrylic based resin on a substrate of polyester PET and condenses light by regularly forming a prism shape.

The flexible printed circuit 130 is formed on one surface of the optical sheet 123. In more detail, the flexible printed circuit 130 is formed on the portion of the optical sheet generally corresponding to the base 112 of the frame 110 on the upper surface of the optical sheet 123 so that the flexible printed circuit can be coupled to the external PCB along the base 112, as described above.

Referring to FIG. 2, the flexible printed circuit 130 includes a planar portion 131 having an edge 132, a panel connecting portion 133 formed on one surface of the planar portion 131, a bending portion 134 connected to the planar portion 131, and an external connecting portion 135 connected to the bending portion 134.

Referring to FIG. 2, the planar portion 131 is a region to be connected to the optical sheet 123. The planar portion 131 is pressed by means of the liquid crystal display panel 150 to support the flexible printed circuit 130.

The edge 132 of the planar portion 131 is connected to the bending portion 134. When the flexible printed circuit 130 is coupled to the coupling groove 113, the edge 132 is coupled to the coupling groove 113, thereby preventing loosening of the flexible printed circuit 130 due to resilience, as described above.

Referring to FIG. 2, the panel connection unit 133 is formed on a surface of the planar portion 131. The panel connecting portion 133 has flexibility so that it is bendable toward the liquid crystal display panel 150 formed on the upper surface of the flexible printed circuit 130. In more detail, the panel connecting portion 133 is bent in the upper surface direction to be electrically connected to a high-density integrated circuit 153 of the liquid crystal display panel 150.

The bending portion 134 is a portion folded to the rear surface of the frame 110 so that the flexible printed circuit 130 is connected to the external PCB. In other words, the planar portion 131 and the edge 132 are coupled to the optical sheet 123, and the bending portion 134 is folded to the rear surface of the frame 110 to be connected to the external PCB.

In this case, the bending portion 134 is resilient towards the liquid crystal display panel 150. In such a case, conventional flexible printed circuit boards may become loosened due to such resilience, thereby undermining reliability and causing loosening of the liquid crystal display panel formed on the upper surface thereof.

However, in the liquid crystal display 100 according to the embodiment of the present invention, the edge 132 of the flexible printed circuit 130 is coupled to the coupling groove 113 of the frame 110, and the sidewalls 111 extend above the coupling groove 113. Therefore, despite the resilience of the bending portion 134, loosening of the flexible printed circuit or of the liquid crystal display panel is prevented or significantly reduced.

The external connecting portion 135 is connected to the bending portion 134. When the bending portion 134 is folded to the rear surface of the frame 110, the external connecting portion 135 is electrically connected to the external PCB.

Referring to FIG. 2, the backlight unit 140 is formed on a rear surface of the flexible printed circuit 130. Therefore, when the flexible printed circuit 130 is assembled in the frame 110, the backlight unit 140 faces the frame 110 to provide light to the light guide plate 122 and the reflection plate 121. The backlight unit 140 is a light source to which high voltage is applied to generate visible light, wherein the light source primarily uses a cold cathode fluorescent lamp (CCFL) or a high brightness light emitting diode.

The liquid crystal display panel 150 is formed on the upper surface of the optical sheet 123. The liquid crystal display panel 150 generally includes an upper substrate 151 having a black matrix and a color filter therein, a lower substrate 152 having a thin film transistor therein, and a liquid crystal injected between the upper substrate 151 and the lower substrate 152.

With further reference to FIG. 2, the high-density integrated circuit 153 may be formed on the upper surface of the lower substrate 152. The high-density integrated circuit 153 is for driving the backlight unit 140 and the liquid crystal display panel 150, and it is electrically connected to the backlight unit 140 through the flexible printed circuit 130. Also, the high-density integrated circuit 153 is electrically connected to the external PCB through the flexible printed circuit 130. Electrical signals are applied to the high-density integrated circuit 153 from the external PCB to power the backlight unit 140 and to display an image on the liquid crystal of the liquid crystal display panel 150.

Hereinafter, the coupling method of the flexible printed circuit 130 to the frame 110 in the liquid crystal display 100 according to an exemplary embodiment of the present invention will be described.

Figure 3:
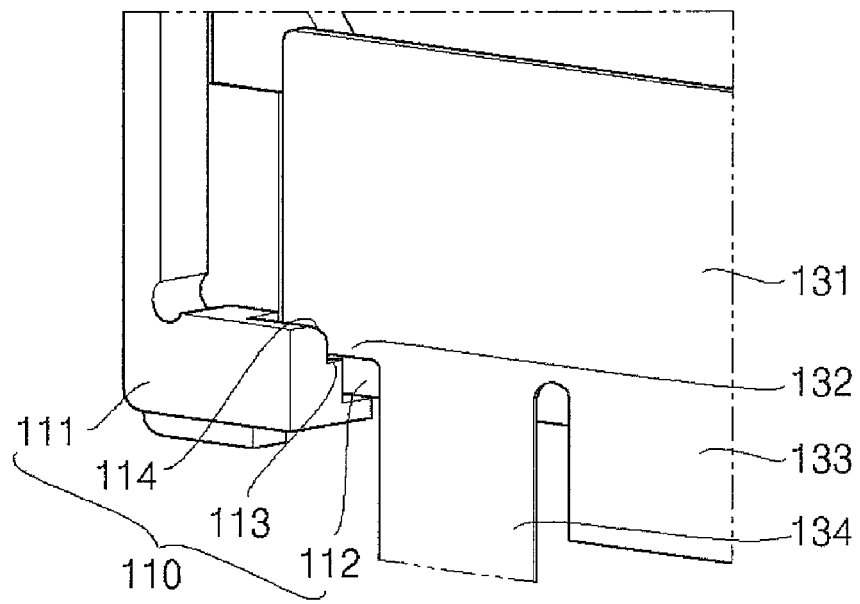
FIG. 3 is a perspective view of a flexible printed circuit adapted to be coupled to a frame of the liquid crystal display according to an embodiment of the present invention.

FIG. 3 is a perspective view of a flexible printed circuit adapted to be coupled to a frame of the liquid crystal display according to an embodiment of the present invention.

Referring to FIG. 3, the edge 132 of the flexible printed circuit 130 is coupled to the coupling groove 113 of the frame 110, and in one embodiment, the edge 132 is inserted into the coupling groove 113. Due to the curved surface 114, if the edge 132 is not exactly aligned with or coupled to the coupling groove 113 in the manufacturing process, a force may be applied toward the coupling groove 113 to make the edge 132 flush along the curved surface 114 to be coupled to the coupling groove 113. In other words, the manufacturing process of the liquid crystal display may be improved.

Hereinafter, the case of the flexible printed circuit bent in the liquid crystal display 100 according to an exemplary embodiment of the present invention will be described.

Figure 4:
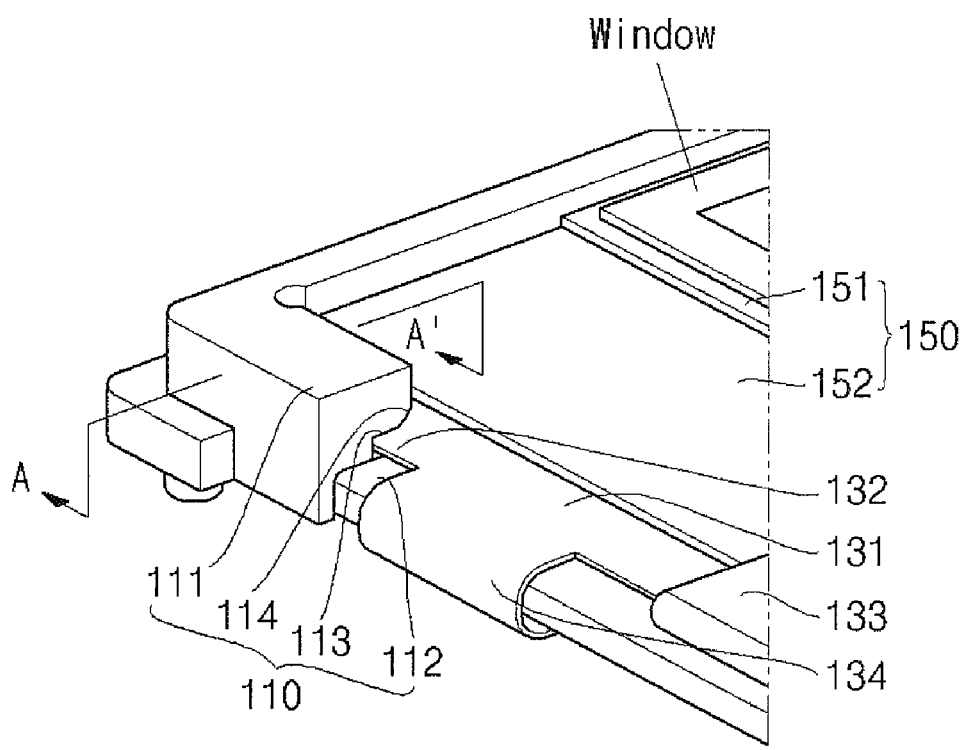
FIG. 4 is a perspective view showing the flexible printed circuit of FIG. 3 coupled to the frame of FIG. 3.

FIG. 4 is a perspective view showing the flexible printed circuit of FIG. 3 coupled to the frame of FIG. 3.

Referring to FIG. 4, the edge 132 is coupled to the coupling groove 113. Therefore, the frame 110 including the coupling groove 113 prevents loosening generated when the bending portion 134 of the flexible printed circuit 130 is folded. Consequently, the problems of looseness of the flexible printed circuit and of the liquid crystal display panel can be prevented or significantly reduced.

Hereinafter, the coupling structure of the flexible printed circuit 130 to the frame 110 in the liquid crystal display 100 according to an exemplary embodiment of the present invention will be described with reference to a cross-sectional view.

Figure 5:
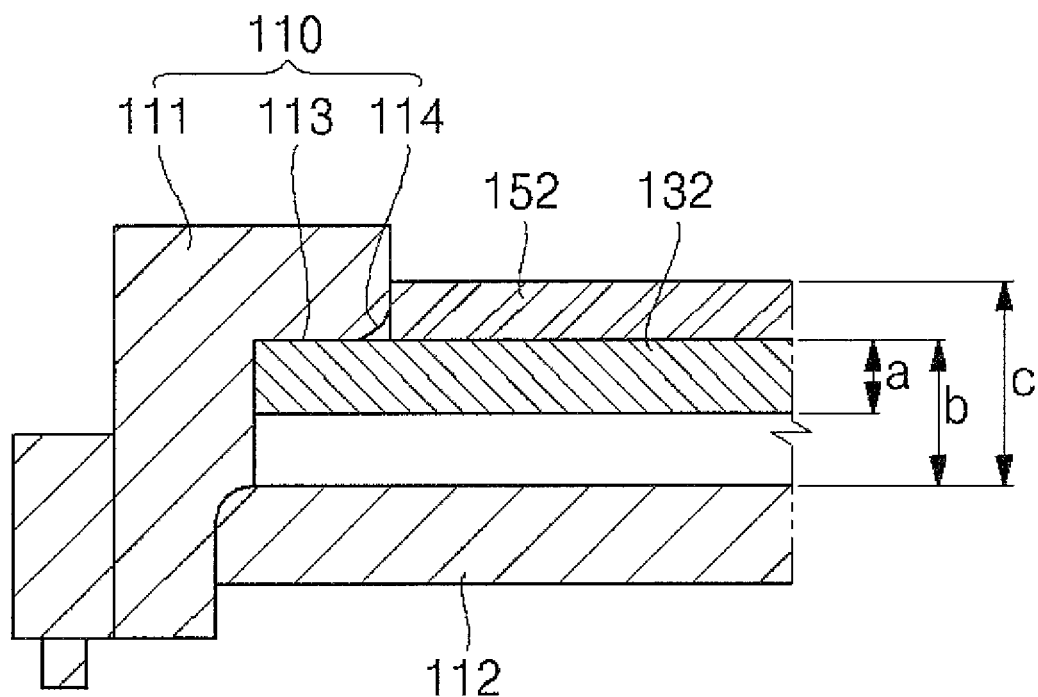
FIG. 5 is a cross-sectional view along line A'A' of FIG. 4 of the flexible printed circuit coupled to the frame of the liquid crystal display according to an embodiment of the present invention.

FIG. 5 is a cross-sectional view along line A'A' of FIG. 4 of the flexible printed circuit coupled to the frame of the liquid crystal display according to an embodiment of the present invention.

Referring to FIG. 5, the edge 132 of the flexible printed circuit 130 is coupled to the coupling groove 113 of the frame 110, and a lower substrate 152 of the liquid crystal display panel 150 is formed on the upper surface of the flexible printed circuit 130. FIG. 5 is for explaining an embodiment of the present invention, but it will be understood that the actual dimensions may vary from what is shown.

Referring to FIG. 5, the edge 132 is inserted into the coupling groove 113 to prevent or significantly reduce resilience of the flexible printed circuit 130. In one embodiment, the thickness b of the coupling groove 113 is thicker than the thickness a of the edge 132 to couple the edge 132 to the coupling groove 113. Also, it will be appreciated that in one embodiment, the thickness c of the coupling groove 113 and the curved surface 114 is thicker than the thickness b of the coupling groove 113.

Hereinafter, the manufacturing method of the liquid crystal display 100 according to an exemplary embodiment of the present invention will be described.

Referring to FIG. 2, the manufacturing method of the liquid crystal display 100 includes the steps of: providing a frame 110, forming a panel lower layer 120 on the upper surface of the frame 110, forming a flexible printed circuit 130 on the panel lower layer 120, and forming a liquid crystal display panel 150 above the panel lower layer 120.

A frame 110 is provided for the liquid crystal display 100 according to the present embodiment. The step of providing the frame includes forming a bezel of steel, for example Steel Use Stainless (SUS), sidewalls 111 molded in the bezel in synthetic resins, and a base 112. The bezel is manufactured by bending and molding a sheet of steel using a press, and the sidewalls 111 and the base 112 are manufactured by molding synthetic resins such as poly carbonate (PC). A plurality of connecting holes are formed in the bezel and a hook is formed in the base so that the frame is assembled by coupling the connecting holes to the hook.

The sidewalls include the coupling groove 113. The edge 132 of the flexible printed circuit 130 is inserted into the coupling groove 113 so that looseness of the flexible printed circuit within the frame can be prevented or significantly reduced as described above. The frame can include the curved surface 114 such that when the edge 132 is inserted into the coupling groove, the edge can be flush with the curved surface 114, as described above.

The step of forming the panel lower layer includes forming the panel lower layer 120 on the upper surface of the frame 110. The panel lower layer 120 includes a reflection plate 121, a light guide plate 122, and an optical sheet 123, as described above. In the step of forming the panel lower layer, the reflection plate 121, the light guide plate 122, and the optical sheet are formed on the upper surface of the frame sequentially.

The step of forming the flexible printed circuit includes forming the flexible printed circuit 130 on one side of the optical sheet 123. The flexible printed circuit 130 includes a planar portion 131, an edge 132 formed on one side of the planar portion 131, a panel connecting portion 133 connected to the planar portion 131, a bending portion 134 connected to the planar portion 131, and an external connecting portion 135 connected to the bending portion 134. In one embodiment, the backlight unit 140 can be formed on the rear of the planar portion 131, as described above.

The step of forming the liquid crystal display panel includes forming the liquid crystal display panel 150 on the upper surface of the panel lower layer 120. The liquid crystal display panel 150 can include an upper substrate 151 having a black matrix and a color filter therein, a lower substrate 152 having a thin film transistor therein, and a high-density integrated circuit 153 formed on the upper of the lower substrate 153, as described above. In one embodiment, a liquid crystal is injected between the upper substrate 151 and the lower substrate 152 as is understood by those of skill in the art.

The liquid crystal display 100 according to embodiments of the present invention can be manufactured, as described above. Also, after manufacturing, the panel connecting portion 133 and the external connecting portion 135 of the flexible printed circuit 130 may be connected to the high-density integrated circuit 153 and the external PCB, respectively.

As described above, the liquid crystal display and the manufacturing method thereof according to the present invention forms a structure having a coupling groove with a curved surface into which the flexible printed circuit is inserted, making it possible to prevent or significantly reduce looseness of the flexible printed circuit and of the liquid crystal display panel due to the resilience of the flexible printed circuit.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A liquid crystal display comprising:
   a frame including a coupling groove;
   an optical sheet supported by the frame; and
   a flexible printed circuit contacting the optical sheet and coupled to the frame at the coupling groove;
   a display panel on the optical sheet, the display panel having an integrated circuit;
   wherein a first portion of the flexible printed circuit is folded in a first direction over the frame and a second portion of the flexible printed circuit is folded in a second direction and is electrically connected to the integrated circuit.

2. The liquid crystal display as claimed in claim 1, wherein the frame comprises:
   sidewalls for supporting a window, wherein the coupling groove is defined by a surface of the sidewalls; and
   a base having a portion absent the sidewalls.

3. The liquid crystal display as claimed in claim 2, wherein the coupling groove is located at an intersection of the sidewalls and the base.

4. The liquid crystal display as claimed in claim 2, wherein the coupling groove is defined by an inner surface of the sidewalls.

5. The liquid crystal display as claimed in claim 2, wherein the sidewalls extend above the coupling groove for preventing loosening of the flexible printed circuit coupled to the coupling groove.

6. The liquid crystal display as claimed in claim 2, wherein the sidewalls include a curved surface on a surface of the coupling groove.

7. The liquid crystal display as claimed in claim 2, wherein a cross-section of the curved surface is a quadrantal shape.

8. The liquid crystal display as claimed in claim 7, wherein the coupling groove has a curved surface adapted to contact the flexible printed circuit when the flexible printed circuit is coupled to the coupling groove.

9. The liquid crystal display as claimed in claim 1, wherein the flexible printed circuit comprises:
   a planar portion; and
   an edge extending along the planar portion, wherein the edge is coupled to the coupling groove.

10. The liquid crystal display as claimed in claim 9, wherein a thickness of the edge is less than a thickness of the coupling groove.

11. A manufacturing method for a liquid crystal display comprising a frame having a coupling groove, the method comprising:
    mounting an optical sheet on the frame;
    mounting a flexible printed circuit on the optical sheet and coupling the flexible printed circuit to the frame at the coupling groove;
    mounting a display panel on the optical sheet, the display panel having an integrated circuit;
    folding a first portion of the flexible printed circuit over an edge of the frame in a first direction; and
    folding a second portion of the flexible printed circuit in a second direction to electrically couple the flexible printed circuit to the integrated circuit.

12. The manufacturing method for the liquid crystal display as claimed in claim 11, the frame comprising:
    sidewalls for supporting a window; and
    a base having a portion absent the sidewalls;
    wherein the coupling groove is defined by at least one surface of the sidewalls.

13. The manufacturing method for the liquid crystal display as claimed in claim 12, wherein the coupling groove is located at an intersection of the sidewalls and the base.

14. The manufacturing method for the liquid crystal display as claimed in claim 12, wherein the coupling groove is defined by an inner surface of the sidewalls.

15. The manufacturing method for the liquid crystal display as claimed in claim 12, wherein the sidewalls extend above the coupling groove for preventing loosening of the flexible printed circuit coupled to the coupling groove.

16. The manufacturing method for the liquid crystal display as claimed in claim 12, wherein the sidewalls include a curved surface defining an upper surface of the coupling groove.

17. The manufacturing method for the liquid crystal display as claimed in claim 12, wherein a cross-section of the curved surface is a quadrantal shape.

18. The manufacturing method for the liquid crystal display as claimed in claim 16, further comprising applying a force to locate the flexible printed circuit flush along the curved surface.

19. The manufacturing method for the liquid crystal display as claimed in claim 11, wherein the flexible printed circuit comprises:
    a planar portion that remains planar during coupling; and
    an edge on the planar portion, the edge coupled to the coupling groove.

20. The manufacturing method for the liquid crystal display as claimed in claim 19, wherein a thickness of an edge of the flexible printed circuit is less than a thickness of the coupling groove.

* * * * *

UNITED STATES PATENT AND TRADEMARK OFFICE
CERTIFICATE OF CORRECTION

| | | |
|---|---|---|
| PATENT NO. | : 7,894,013 B2 | Page 1 of 1 |
| APPLICATION NO. | : 12/165265 | |
| DATED | : February 22, 2011 | |
| INVENTOR(S) | : Jaemo Chung et al. | |

It is certified that error appears in the above-identified patent and that said Letters Patent is hereby corrected as shown below:

On the Title Page

(30) Foreign Application Priority Data

Insert -- (30) Foreign Application Priority Data
July 2, 2007
(KR) 10-2007-0066199 --

Signed and Sealed this
Twenty-seventh Day of March, 2012

David J. Kappos
*Director of the United States Patent and Trademark Office*